United States Patent
Schenker

(10) Patent No.: US 6,428,936 B1
(45) Date of Patent: Aug. 6, 2002

(54) METHOD AND APPARATUS THAT COMPENSATES FOR PHASE SHIFT MASK MANUFACTURING DEFECTS

(75) Inventor: Richard E. Schenker, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/465,520

(22) Filed: Dec. 16, 1999

(51) Int. Cl.[7] .............................. G03F 9/00; G03C 5/00
(52) U.S. Cl. ........................................... 430/5; 430/323
(58) Field of Search ..................... 430/5, 322, 323, 430/324

(56) References Cited

U.S. PATENT DOCUMENTS

| | | | | |
|---|---|---|---|---|
| 5,302,477 A | * | 4/1994 | Dao et al. | 430/5 |
| 5,308,722 A | | 5/1994 | Nistler | |
| 5,376,483 A | * | 12/1994 | Rolfson | 430/5 |
| 5,549,995 A | * | 8/1996 | Tanaka et al. | 430/5 |

\* cited by examiner

Primary Examiner—S. Rosasco
(74) Attorney, Agent, or Firm—Blakely, Sokoloff, Taylor & Zafman LLP

(57) ABSTRACT

An apparatus is described comprising a phase shift mask having a transparent region. The transparent region comprises an etched region of a transparent layer. The etched region has a final etch depth that corresponds to a designed for phase shift and the designed for phase shift is greater than 180°.

42 Claims, 5 Drawing Sheets

METHOD AND APPARATUS THAT COMPENSATES FOR PHASE SHIFT MASK MANUFACTURING DEFECTS

FIELD OF INVENTION

The field of invention relates to lithography in general and, more specifically, to the manufacturing of phase shift masks used in semiconductor processing.

BACKGROUND OF THE INVENTION

Phase shift masks have received increased attention over the years as semiconductor device size continues to shrink. Phase shift masks involve the technique of passing light through transparent mask regions where some transparent mask regions shift the phase of the light through the mask as compared to other transparent mask regions. Thus light that passes through a phase shifting mask contains regions of light that are out of phase with respect to one another.

Traditionally, phase shift masks pass 180° shifted light and unshifted (i.e., 0° phase shift) light. This produces regions of light that are out of phase by 180° with respect to each other. Due to deconstructive interference principles, no light intensity exists where these regions of light overlap on a substrate surface. That is, on the substrate surface where light from the two regions overlap, the 180° shifted light region cancels out the 0° shifted region. The overlap occurs due to the natural spreading of light after it passes through a transparent region of the mask. The spreading may also be referred to as fringing.

By strategically patterning the transparent regions on the mask that corresponds to shifted and non-shifted light such that overlap occurs at specific locations on the substrate surface; the resulting deconstructive interference may be used to enhance optical contrast on the substrate surface. Enhanced optical contrast results in the ability to produce smaller features (such as gates, contacts and metal lines) on the substrate surface. Thus phase shift masks may be used to produce smaller features on the surface of a substrate.

A problem with phase shift masks concerns the result of manufacturing defects in the transparent regions associated with the mask. These manufacturing defects are usually caused by imperfect etching of the transparent regions. A transparent region is etched in order to determine its phase shift as compared to other non etched transparent regions. Typically, etched transparent regions have an 180° phase shift while non etched regions have a 0° phase shift. The depth of the etch determines the amount of phase shift that occurs.

FIGS. 1a and 1b show an example of the type of defects described above. If an unwanted portion 102 of resist layer 101 or opaque layer 111 or other material remains on the transparent layer 103 during the etching of the transparent layer 103 an imperfection 104 in the transparent region 105 is formed. Since the depth 106 of the transparent region 105 controls the phase shift through the transparent region 105, imperfection 104 results in an incorrect phase shift for light that passes through imperfection 104. The defect 102 and 104 can extend completely over the transparent region 105.

U.S. Pat. No. 5,308,722 entitled "Voting Technique For The Manufacture of Defect-Free Printing Phase Shift Lithography" issued on May 3, 1994 describes a voting technique that addresses the defect problem. A voting technique involves multiple etch steps in order to reduce the effects of a defect mechanism. For example, as shown in FIGS. 2a–2e, the "one step" etch of FIGS. 1a and 1b is expanded to a "two-step" etch (also referred to as a "twice voted" etch).

After a first resist layer 201 patterning (FIG. 2a), transparent layer 203 etch (FIG. 2b) and resist layer 201 removal (FIG. 2c), a second resist layer 207 is patterned (FIG. 2d) prior to a second transparent region 205 etch (FIG. 2e). The consequence of the "two step" etch is seen in the height 210 of the imperfection 204.

Whereas the height 110 of the "one step" etch imperfection 104 is approximately equal to the final etch depth 106 of the transparent region 105; the height 210 of the two step imperfection 204 is approximately half of this depth 206. Voting techniques therefore take advantage of the random location of imperfections per resist patterning, transparent region etch and resist removal sequence. The result is lower imperfection height 210.

Prior art voting techniques are traditionally limited to a final etch depth 106, 206 that corresponds to a 180° phase shift. As described ahead, however, the overall effects of imperfections 104, 204 on the devices (such as semiconductor devices) manufactured with phase shift masks may be further reduced by other final etch depth approaches.

SUMMARY OF THE INVENTION

An apparatus comprising a phase shift mask having a transparent region. The transparent region comprises an etched region of a transparent layer. The etched region has a final etch depth that corresponds to a designed for phase shift that is greater than 180°.

BRIEF DESCRIPTION OF THE DRAWINGS

The present invention is illustrated by way of example and not limitation in the figures of the accompanying drawings, in which like references indicate similar elements, and in which.

DETAILED DESCRIPTION

Figure 1A:
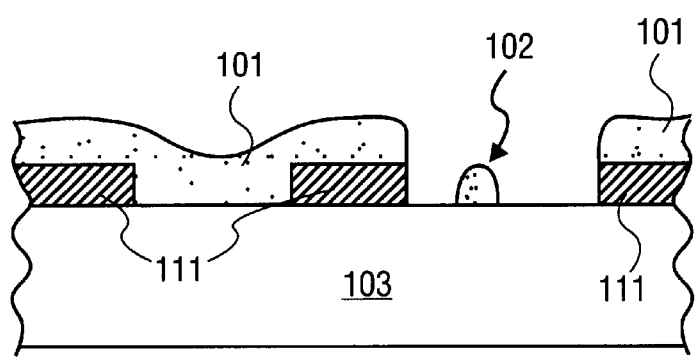
FIGS. 1a and 1b show a depiction of a manufacturing defect associated with the making of a phase shifting mask.

An apparatus is described comprising a phase shift mask having a transparent region. The transparent region comprises an etched region of a transparent layer. The etched region has a final etch depth that corresponds to a designed for phase shift and the designed for phase shift that is greater than 180°.

A method is described comprising etching to a final etch depth a transparent layer associated with a transparent region of a phase shift mask where the final etch depth corresponds to a designed for phase shift and the designed for phase shift is greater than 180°.

A method is described comprising passing light through a phase shift mask onto a substrate fixed to receive the light, where the light is within a photolithographic system, and a portion of the light is shifted greater than 180° after passing through the phase shift mask.

As discussed in the background, a phase shift mask's etched transparent regions traditionally correspond to mask regions designed to shift light 180°. On the surface of a substrate material that is positioned to intercept light traveling through the mask (such as the surface of a semiconductor wafer coated with photoresist placed within a photolithographic stepper), the shifted light cancels out non shifted light where they overlap due to deconstructive interference.

Referring to FIG. 2, transparent layer 203 is typically comprised of fused silica, however other materials such as fused quartz or calcium fluoride among others may be used as well. The mask also has an opaque layer 220 which is typically comprised of chrome (Cr), however, other materials such as Chromium Fluoride or amorphous silica among others may be used as well. The transparent and opaque materials listed above are illustrative and should not be used to limit the invention. For example, the present teachings may be used with respect to applications where the exposure radiation is outside the visible spectrum such as x-ray or Extreme Ultra Violet (EUV) applications. As Such, the term "light" may be used, for simplicity, to refer to the exposure radiation used in visible as well non-visible applications.

A transparent layer 203 is therefore any mask layer that substantially allows the passage of exposure light used in a photolithographic system. Also, an opaque layer 220 is therefore any mask layer that substantially blocks the passage of exposure light used in a photolithographic system. A photolithographic system is any system that uses light to produce features on a substrate such as a lithographic stepper commonly used in semiconductor manufacturing environments.

A transparent region (e.g. region 205) is any region of the mask's transparent layer 203 where an opaque layer 220 does not block light traveling through the region. On a phase shift mask as discussed above, some transparent regions are etched in order to produce a phase shift while other transparent regions are not etched such that no phase shift results. Etching is any method or technique that may be used to remove transparent layer 203 material. Examples include plasma etching with an etch gas such as $F_4$, $SF_6$ or $NF_3$.

The patterns of shifting (i.e., etched) and non shifting (i.e., non etched) transparent regions on the mask are designed to create overlap on the substrate surface in strategic locations such that unwanted fringing associated with the optical images used to form features on the substrate are canceled out. Such unwanted optical images may be referred to as fringing optical images.

Canceling out fringing optical images results in smaller achievable feature sizes on the substrate. The final etch depth (e.g., depth 106, 206 of FIGS. 1 and 2) is the "designed for" depth 106, 206 of an etched transparent region 105, 205. Prior art techniques traditionally design for a final etch depth 206 that corresponds to a phase shift of 180°. The etch depth needed to produce a certain phase shift typically depends upon the transparent layer 203 material and the wavelength of light used. Etch depths are readily determinable by those skilled in the art.

For a "two step" etching sequence (such as the sequence shown with respect to FIG. 2) having a final etch depth 206 that corresponds to a 180° phase shift, any imperfection (e.g., imperfection 204) corresponds to 90° shifted light rather than 180° shifted light (since the height 210 of the imperfection 204 is one half the height of the final etch depth 206).

The light passing through the imperfection 204 therefore has a phase shift error of 90° ($|180°-90°|=90°$). Phase shift error is the absolute value (i.e., magnitude) of the difference between 180° and the phase of the shifted light.

Thus light that passes through transparent region 205 will have a portion that passes through imperfection 204 resulting in a phase shift error of 90°. The remaining light that passes through transparent region 205 (but not imperfection 204), which typically encompasses most of the light passing through transparent region 205 (since the imperfection 204 is typically small), has a phase shift error of 0° since $|180°-180°|=0°$.

The effectiveness of shifted light is inversely proportional to the phase shift error. That is, as the phase of shifted light deviates away from 180° (e.g., from 180° to 90° because of imperfection 204) its ability to cancel out fringing optical images diminishes. Comparing FIGS. 1 and 2, the two step etch technique of FIG. 2 reduces the phase shift error from 180° ($|180°-0°|$) in FIG. 1 to 90° ($|180°-90°|$) in FIG. 2.

It may be observed then, that the prior art voting technique of FIG. 2 results in phase shift errors given by Equation 1:

$$\text{Phase Shift Error} = 180°/n \qquad \text{Eqn.1}$$

Where n is the number of etch steps (and assuming two imperfections do not form in the same location).

Note that the etch depth 230 is associated with the first etch step and the etch depth 231 is associated with the second etch step. These depths 230, 231 may also be referred to as etch step depths 230,231. Each etch step depth 230, 231 in FIG. 2 corresponds to a phase shift of 90°. Thus the etch step depths 230, 231 are the same. The summation of the phase shifts associated with each etch step depth 230, 231 (90°+90°=180°) corresponds to the final etch depth 206. Note that the second etch depth 231 is the same length as the imperfection height 210.

From Equation 1, it is apparent that increasing the number of etch steps improves the utility of the mask by reducing its associated phase shift error(s). However, increasing the number of etch steps adds cost to the mask manufacturing process. Thus, an approach that embraces better phase shift error reduction (as a function of the number of etch steps) than the relationship described by Equation 1 is a less expensive solution from the perspective of mask manufacturing costs.

Because light wave amplitudes are symmetrical, the effectiveness of a shifted light region to cancel out fringing optical images is a function of its phase shift error. For phase shift errors of 0° (i.e., light shifted by 180°), the desired cancellation is theoretically perfect. That is, no light intensity results in regions of overlap with unshifted light on the substrate surface as the fringing optical images are perfectly eliminated.

For non-zero phase shift errors, the cancellation is less than perfect. That is, some light intensity results in regions of overlap on the substrate surface. The presence of light intensity in overlapping regions has traditionally been undesirable because the elimination of fringing optical images is not perfectly achieved. Better said, some fringing optical images remain on the substrate.

However, provided the non-zero light intensity remains small within the overlapping regions, the resulting presence of the fringing optical images will not significantly effect the dimensions of the features manufactured on the substrate surface. For example, transistor gates will not appreciably extend beyond their desired length.

Thus, although perfect elimination of the fringing optical images is optimal, it is not necessary. Final etch depths 206 may therefore correspond to phase shifts other than 180° and still produce acceptable manufactured features on the surface of the substrate. The maximum amount of permissible light intensity within the overlapping area is dependent on a number of readily available process parameters such as exposure time, exposure intensity and the type of photoresist used on the substrate.

As parameters such as these may vary from application to application, one of ordinary skill may determine the amount of allowable phase shift error for his or her specific situation.

Once the amount of permissible phase shift error is defined for the particular application, an approach that purposefully introduces phase shift error in the "designed for" phase shift may be employed to improve upon the relationship described by Equation 1. Such an approach involves the formation of a final etch depth 206 that corresponds to phase shifts other than 180°.

The present embodiment involves the formation of a final etch depth that corresponds to a phase shift given by Equation 2:

Designed For Phase Shift Through Transparent Region=360n/(2n−1)  Eqn. 2 where n is the number of etch steps. Table 1 below shows the "designed for" phase shift according to Equation 2 for up to 5 etch steps. This means the final etch depth corresponds to the phase shift provided by Equation 2. The phase shift that is designed for according to Equation 2 should be within the permissible phase shift error for the particular application.

TABLE 1

| Number of Etch Steps | Designed For Phase Shift | Phase Shift Error |
|---|---|---|
| 2 | 240° | 60° |
| 3 | 216° | 36° |
| 4 | 205.7° | 25.7° |
| 5 | 200° | 20° |

As discussed, because light wave amplitudes are symmetrical, the ability of shifted light to cancel out the fringing optical images is a function of its phase shift error. Since phase shift error is defined by an absolute value, shifted lightwaves having a phase shift error equidistant from 180° have an identical cancellation effect on the substrate surface. For example, light that is shifted 177° has the same cancellation effect as light that is shifted 183°. In this example, since both lightwaves (the 177° and 183° waves) have a phase shift error of 3°, both lightwaves have the same cancellation effect on the substrate.

This fact may be taken advantage of such that the presence of a manufacturing defect does not detrimentally affect the cancellation of fringing optical images on the substrate surface. This is possible if the phase shift error of light that passes through an imperfection 204 is identical to the phase shift error of light that passes through the final etch depth 206. Passing through the final etch depth means light passes through the etched transparent region 205 but not through the imperfection 204 within the etched transparent region 205.

The phase shift error of light passing through an imperfection 204 will be equal to the phase shift error of light passing through the final etch depth 206 if the etch step depths associated with each etch are an equal division of the designed for phase shift. For example, referring to the three etch step embodiment of Table 1 as an example, the etch step depth for each of the three etches corresponds to a phase shift of 72° (216°/3=72°).

Thus, if one or more imperfections exist (again assuming subsequent etching does not form imperfections upon one another) the phase shift experienced by light that passes through an imperfection will experience a phase shift of 144°. A phase shift of 144° corresponds to a phase shift error of 36°.

Note from Table 3 that the designed for phase shift of 216° also has a phase shift error of 36°. Since light passing though either the imperfection or the final etch depth possess a phase shift error of 36°, the imperfection is not noticeable in regard to the cancellation effect of the fringing optical images on the substrate.

Figure 2A:
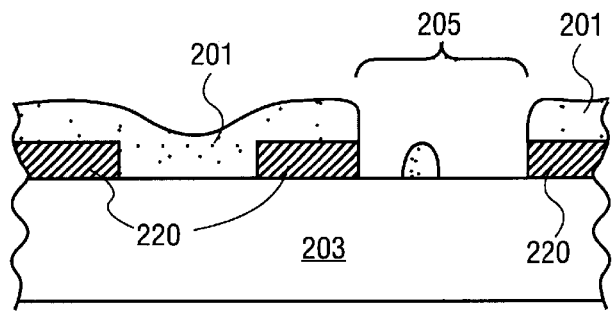
FIGS. 2a through 2e show a prior art voting technique used to compensate for a phase shift mask manufacturing defect.
Figure 2B:
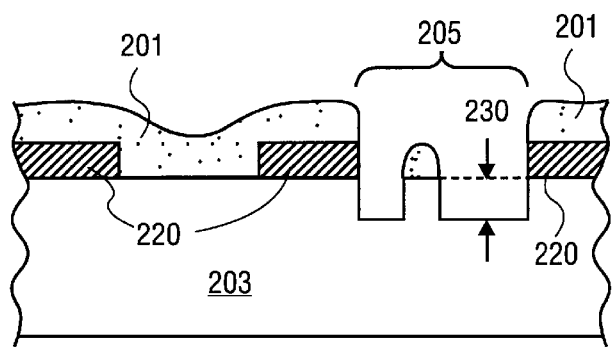
Figure 2C:
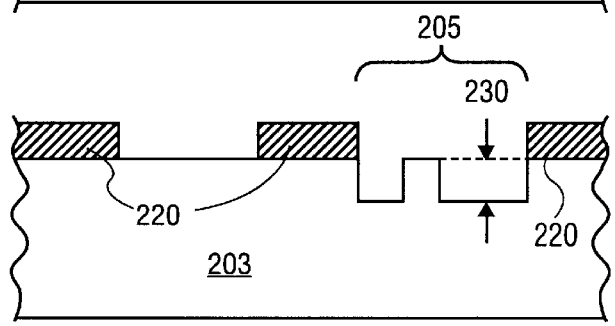
Figure 2D:
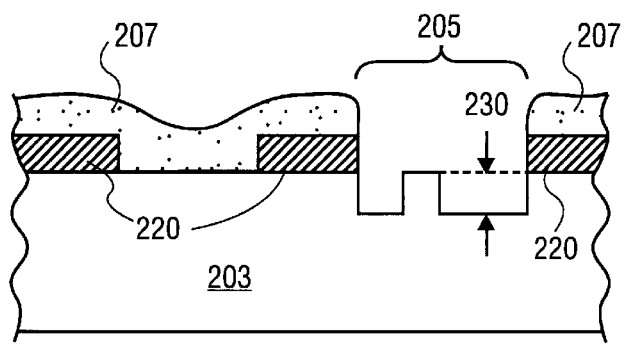
Figure 2E:
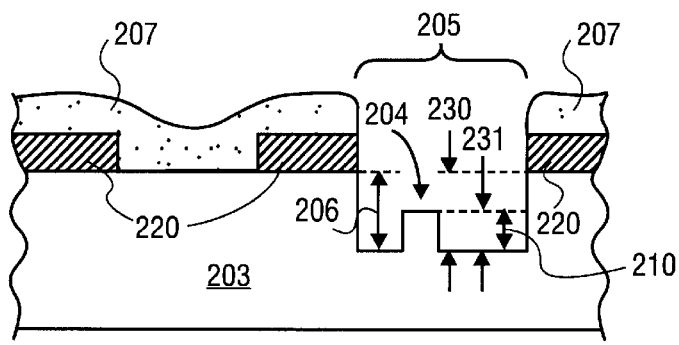

FIG. 3 shows an example of the three step etch process just described. After a first resist layer 301 patterning (FIG. 3a), the transparent region 305 is etched to a first etch step depth 330 that corresponds to a phase shift of 72° (FIG. 2b). Note, however, the formation of a first imperfection 304 due to the unwanted resist material 315 over transparent region 305.

Figure 3A:
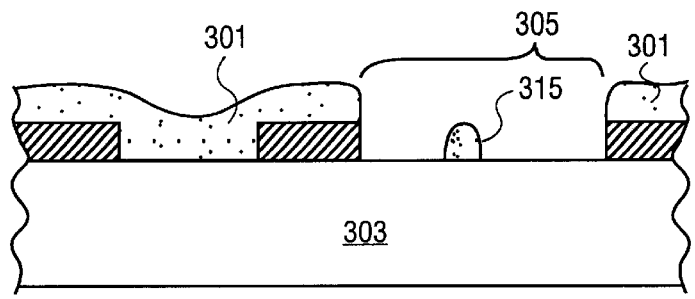
FIGS. 3a through 3i show a method and apparatus of one embodiment having improved defect compensation as compared to the prior art technique show with respect to FIG. 2.
Figure 3B:
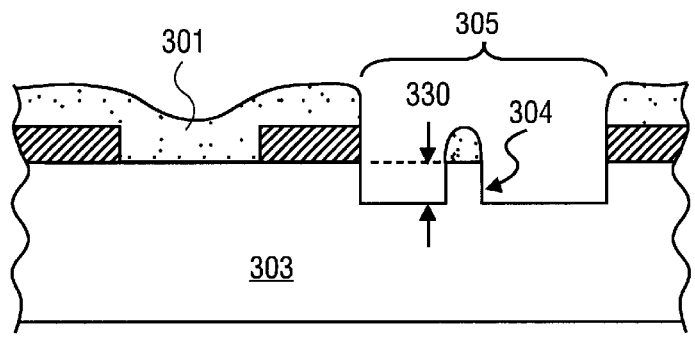
Figure 3C:
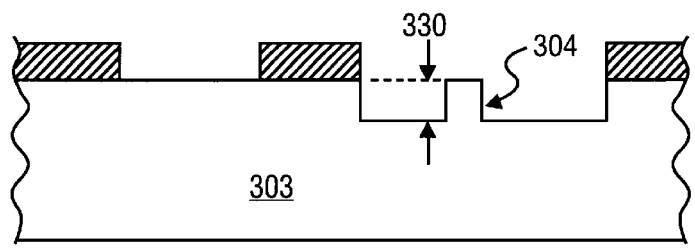
Figure 3D:
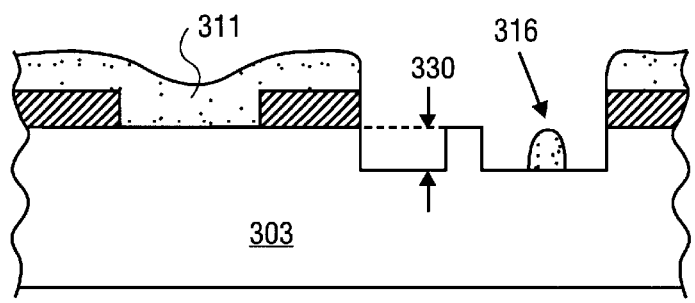
Figure 3E:
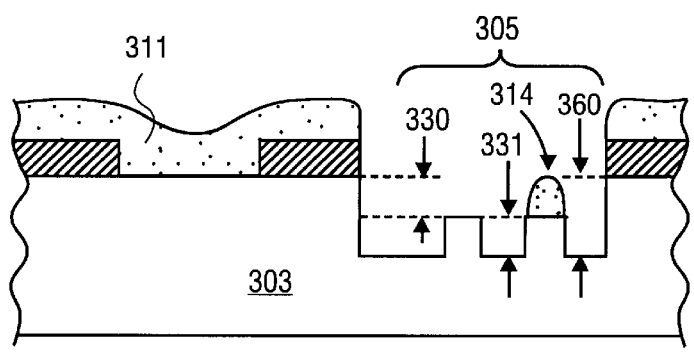
Figure 3F:
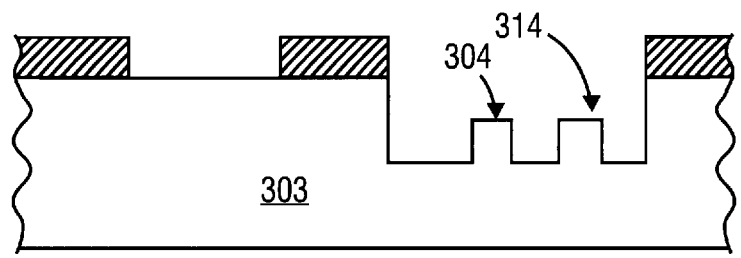

After the first resist layer 301 is removed (FIG. 3c) a second resist layer 311 is patterned which leaves a second unwanted resist material 316 (FIG. 3d). During a second etch step having a second etch step depth 331 equal to first etch depth 330 (which corresponds to another 72° of phase shift), the resulting depth 360 of the transparent region 305 corresponds to a phase shift of 144°. FIG. 3e shows the mask after the second etch. Note the presence of a second imperfection 314. FIG. 3f shows the mask after the second resist layer 311 is removed.

Figure 3G:
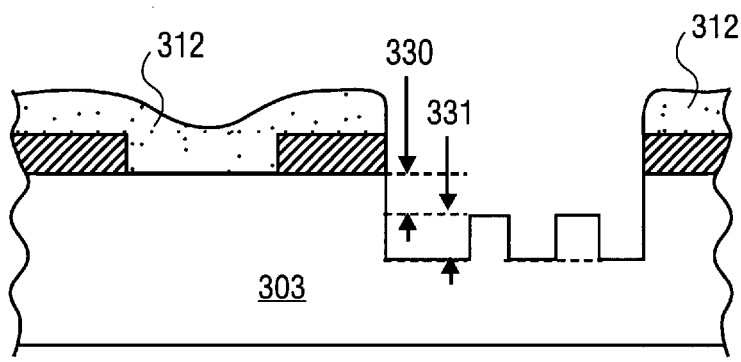
Figure 3H:
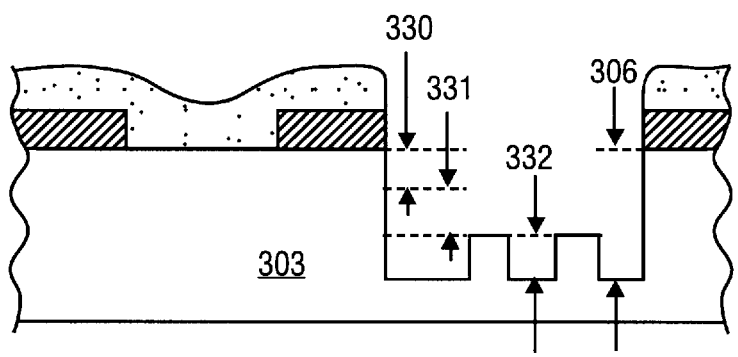

Next, a third resist layer 312 is patterned (FIG. 3g). Note that no unwanted resist material results unlike the first two resist patternings. During a third etch step (FIG. 3h), again having a third etch step depth 332 that corresponds to a phase shift of 72°, the final etch depth 306 is formed (FIG. 3g).

Figure 3I:
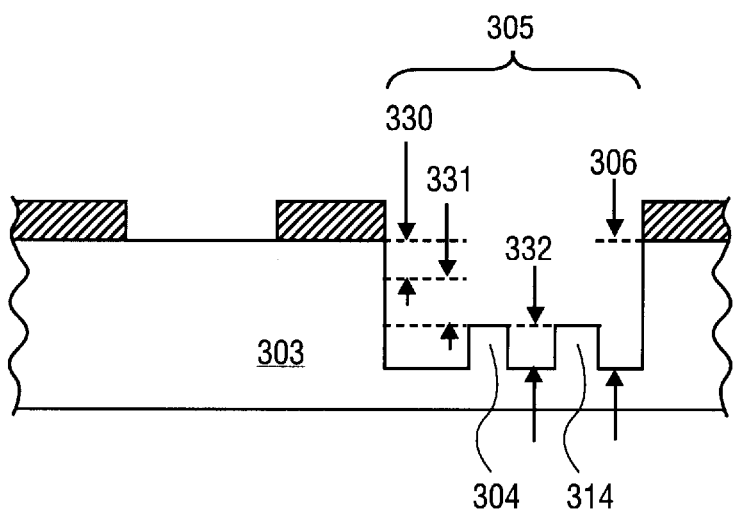

Referring to FIG. 3i (i.e., after the third resist layer 312 is removed), the final etch depth 306 has a corresponding phase shift of 216°. Note that the size of imperfections 304, 314 correspond to phase shifts of 144° for light that travels through imperfections 304, 314. Thus all light that emerges from transparent region 305 will have a phase shift error of 36°.

Figure 4:
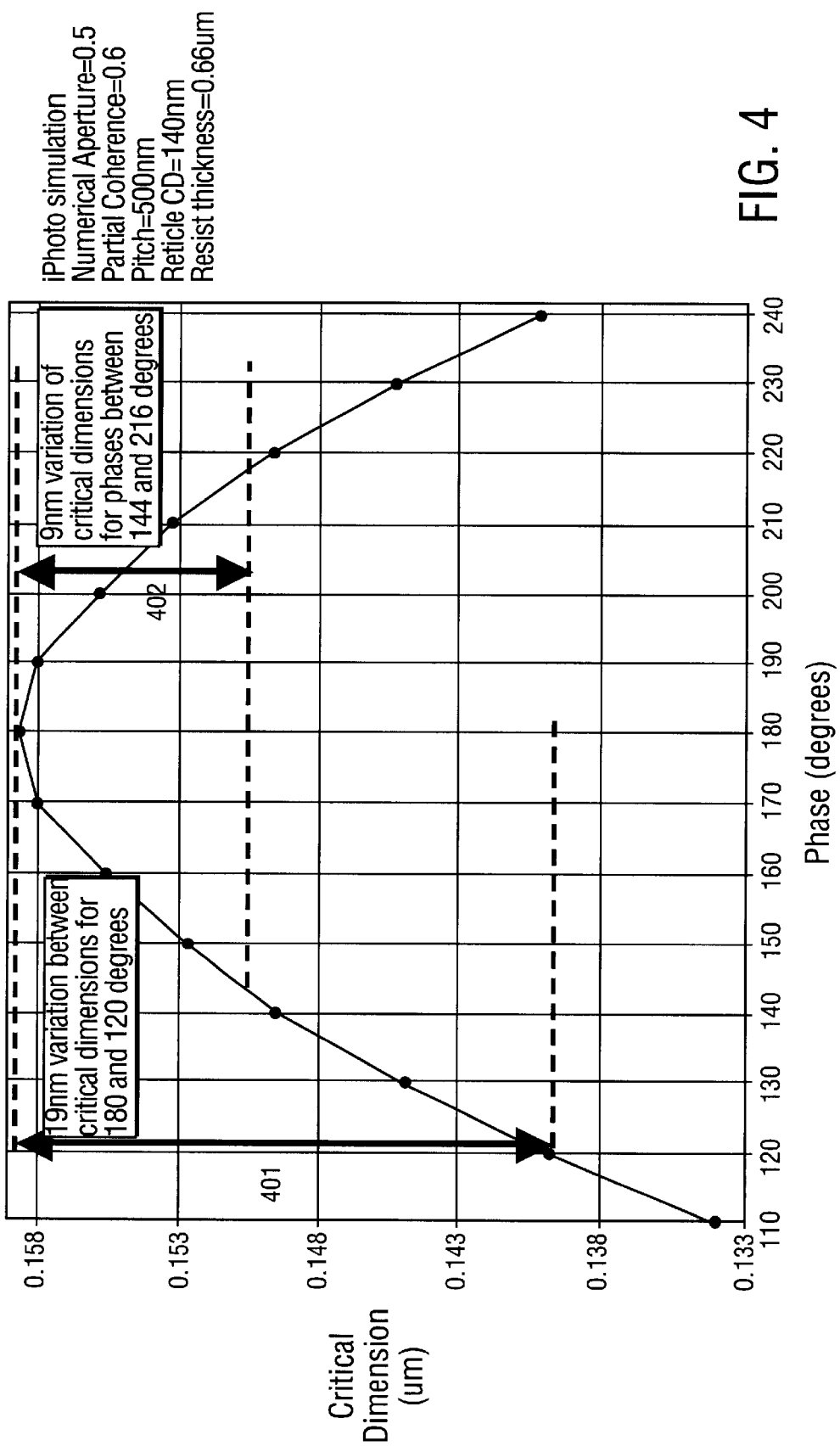
FIG. 4 shows a demonstration of the improvement in critical dimension variation when the method of FIG. 3 is employed (as compared to a prior art technique).

FIG. 4 shows the simulated improvement of the technique characterized by Equation 2 over the technique characterized by Equation 1 for an alternating phase shift mask. That is, FIG. 4 shows the advantage (as simulated by a lithography simulator of a technique having a non-180° designed for phase shift as compared to a technique having a 180° designed for phase shift for the same number of etch steps.

FIG. 4 compares the variation in the smallest feature sizes (also referred to as critical dimensions) formed on a substrate for a three etch step prior art approach and the approach characterized by Equation 2. Note the critical dimension variation 401 (approximately 0.159 um−0.140 um=0.019 um) of the prior art technique (having an imperfection that corresponds to a phase shift of 120° and a designed for phase shift of 180°) is larger than the critical dimension variation 402 (approximately 0.159 um−0.150 um=0.009 um) of the technique characterized by Equation 2 (having an imperfection that corresponds to a phase shift between 144° and a designed for phase shift of 216°).

The simulation used typical stepper operating conditions with a numerical aperture of 0.5 partial coherence setting of 0.6 and a wavelength of 248 nm. The pattern simulated was that of 150 nm lines at 500 nm pitch. A resist model was used that emulates commercially available photoresist.

Figure 1B:
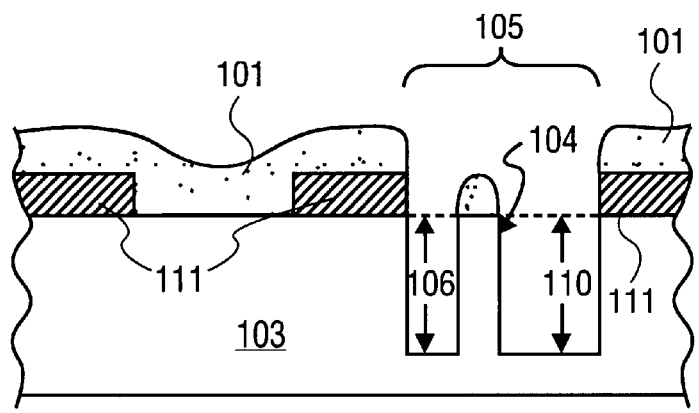

It is important to note that the present discussion is applicable to different phase shift mask types. That is, different mask structure strategies may be employed to introduce a phase shift by passing light through an etched transparent region. One mask type, referred to as an alternating phase shift mask, employs a periodic pattern of etched and non etched transparent regions separated by an opaque region. FIGS. 1 through 3 are indicative of the type of transparent region structure typically found in alternating phase shift masks.

Another type of phase shift mask, referred to as a rim phase shift mask typically etches the central portion, but not the outer rim, of a transparent region. This type of phase shift mask also typically employs the use of etching to introduce phase shifts of 180° into light that passes through the mask. Thus, rim phase shift masks may similarly opt for a designed for phase shift other than 180° in order to compensate for manufacturing defects as explained above.

The present invention is applicable to other mask manufacturing processes than the specific process shows with respect to FIG. 3. For example, instead of etching, a transparent dielectric material can be selectively deposited to shift the phase of light traveling through selective regions of the mask.

What is claimed is:

1. An apparatus, comprising:
a phase shift mask having a transparent region, said transparent region comprising a shallow etched region of a transparent layer and a deep etched region of said transparent layer, said deep etched region having a final etch depth that is deeper than said shallow etched region, said final etch depth corresponding to a designed for phase shift, said designed for phase shift greater than 180°, said designed for phase shift designed to be $(360n/(2n-1))°$ where n is a number of discrete etches used to reach said final etch depth.

2. The apparatus of claim 1 wherein said transparent layer further comprises fused silica ($SiO_2$).

3. The apparatus of claim 1 wherein said transparent layer further comprises calcium fluoride.

4. The apparatus of claim 1 wherein said transparent layer further comprises quartz.

5. The apparatus of claim 1 wherein said phase shift mask further comprises an opaque layer.

6. The apparatus of claim 5 wherein said opaque layer further comprises chrome.

7. The apparatus of claim 5 wherein said opaque layer further comprises amorphous silicon.

8. The apparatus of claim 1 wherein said phase shift mask is further coupled to a photolithographic system.

9. The apparatus of claim 8 wherein said photolithographic system further comprises a substrate placed to receive light that passes through said mask.

10. The apparatus of claim 9 wherein said substrate further comprises a silicon wafer.

11. A method, comprising:
etching a transparent layer associated with a transparent region of a phase shift mask to a final etch depth, said etching comprising a number of discrete etches into said transparent layer, said final etch depth corresponding to a designed for phase shift, said designed for phase shift greater than 180°, said designed for phase shift designed to be $(360n/(2n-1))°$ where n is said number of discrete etches.

12. The method of claim 11 wherein said designed for phase shift is 240°.

13. The method of claim 11 wherein said designed for phase shift is 216°.

14. The method of claim 11 wherein said designed for phase shift is 205.7°.

15. The method of claim 11 wherein said designed for phase shift is 200°.

16. A method, comprising:
passing light through a phase shift mask onto a substrate fixed to receive said light, said light within a photolithographic system, a first portion of said light passing through an unetched portion of a transparent layer of said phase shift mask, a second portion of said light shifted less than 180° after passing through a shallow etched region of said phase shift mask, and a third portion of said light shifted greater than 180° after passing through a deep etched region of said phase shift mask, said third portion of said light designed to be shifted $(360n/(2n-1))°$ where n is a number of discrete etches used to reach a final etch depth of said deep etched region.

17. The method of claim 16 wherein said third portion of said light is shifted 240°.

18. The method of claim 16 wherein said third portion of said light is shifted 216°.

19. The method of claim 16 wherein said third portion of said light is shifted 205.7°.

20. The method of claim 16 wherein said third portion of said light is shifted 200°.

21. The method of claim 16 wherein said substrate is a silicon wafer.

22. An apparatus, comprising:
a phase shift mask having a transparent region, said transparent region comprising a shallow etched region of a transparent layer and a deep etched region of said transparent layer, said deep etched region having a final etch depth that is deeper than said shallow etched region, said final etch depth corresponding to a designed for phase shift, said designed for phase shift greater than 180° and less than or equal to 240°, said designed for phase shift designed to be $(360n/(2n-1))°$ where n is a number of discrete etches used to reach said final etch depth.

23. The apparatus of claim 22 wherein said transparent layer further comprises fused silica ($SiO_2$).

24. The apparatus of claim 22 wherein said transparent layer further comprises calcium fluoride.

25. The apparatus of claim 22 wherein said transparent layer further comprises quartz.

26. The apparatus of claim 22 wherein said phase shift mask further comprises an opaque layer.

27. The apparatus of claim 26 wherein said opaque layer further comprises chrome.

28. The apparatus of claim 26 wherein said opaque layer further comprises amorphous silicon.

29. The apparatus of claim 22 wherein said phase shift mask is further coupled to a photolithographic system.

30. The apparatus of claim 29 wherein said photolithographic system further comprises a substrate placed to receive light that passes through said mask.

31. The apparatus of claim 30 wherein said substrate further comprises a silicon wafer.

32. A method, comprising:
etching a transparent layer associated with a transparent region of a phase shift mask to a final etch depth, said etching comprising a number of discrete etches into said transparent layer, said final etch depth corresponding to a designed for phase shift, said designed for phase shift greater than 180° and less than or equal to 240°, said designed for phase shift designed to be $(360n/(2n-1))°$ where n is said number of said discrete etches.

33. The method of claim 32 wherein said designed for phase shift is 240°.

34. The method of claim 32 wherein said designed for phase shift is 216°.

35. The method of claim 32 wherein said designed for phase shift is 205.7°.

36. The method of claim 32 wherein said designed for phase shift is 200°.

37. A method, comprising:

passing light through a phase shift mask onto a substrate fixed to receive said light, said light within a photolithographic system, a first portion of said light passing through an unetched portion of a transparent layer of said phase shift mask, a second portion of said light shifted greater than or equal to 0° and less than 180° after passing through a shallow etched region of said phase shift mask, and a third portion of said light shifted greater than 180° and less than or equal to 240° after passing through a deep etched region of said phase shift mask, said third portion of said light designed to be shifted $(360n/(2n-1))°$ where n is a number of discrete etches used to reach a final etch depth of said deep etched region.

38. The method of claim 37 wherein said third portion of said light is shifted 240°.

39. The method of claim 37 wherein said third portion of said light is shifted 216°.

40. The method of claim 37 wherein said third portion of said light is shifted 205.7°.

41. The method of claim 37 wherein said third portion of said light is shifted 200°.

42. The method of claim 37 wherein said substrate is a silicon wafer.

* * * * *